US007812659B1

(12) United States Patent
Shumarayev et al.

(10) Patent No.: US 7,812,659 B1
(45) Date of Patent: Oct. 12, 2010

(54) CLOCK SIGNAL CIRCUITRY FOR MULTI-CHANNEL DATA SIGNALING

(75) Inventors: Sergey Shumarayev, San Leandro, CA (US); Rakesh H Patel, Cupertino, CA (US); William W Bereza, Nepean (CA); Tim Tri Hoang, San Jose, CA (US); Thungoc Tran, San Jose, CA (US)

(73) Assignee: Altera Corporation, San Jose, CA (US)

( * ) Notice: Subject to any disclaimer, the term of this patent is extended or adjusted under 35 U.S.C. 154(b) by 1190 days.

(21) Appl. No.: 11/432,420

(22) Filed: May 10, 2006

Related U.S. Application Data

(60) Provisional application No. 60/705,521, filed on Aug. 3, 2005.

(51) Int. Cl.
*G06F 1/04* (2006.01)
*H04L 7/00* (2006.01)

(52) U.S. Cl. .............. 327/291; 327/293; 327/297; 327/141; 375/354; 375/375; 375/376; 326/93; 326/39; 326/41

(58) Field of Classification Search .......... 713/400, 713/401; 375/220, 260, 354, 376; 327/141, 327/145, 147, 156; 326/38–41, 86
See application file for complete search history.

(56) References Cited

U.S. PATENT DOCUMENTS 4,486,739 A  12/1984  Franaszek et al.
5,451,892 A * 9/1995  Bailey ................. 327/113
5,881,271 A * 3/1999  Williams .............. 713/401
6,888,376 B1 * 5/2005  Venkata et al. ........ 326/41
7,272,677 B1 * 9/2007  Venkata et al. ........ 710/71
7,276,936 B1 * 10/2007  Hoang et al. .......... 326/41
7,304,498 B2 * 12/2007  Bereza et al. .......... 326/38
7,304,507 B1 * 12/2007  Tran et al. ............ 326/93
7,581,131 B1 * 8/2009  Prasad et al. ......... 713/401
7,590,207 B1 * 9/2009  Shumarayev et al. ... 375/354
7,656,187 B2 * 2/2010  Tran et al. ............ 326/38
2005/0200390 A1  9/2005  Starr et al.
2007/0030184 A1 * 2/2007  Nguyen et al. ........ 341/100
2007/0127616 A1 * 6/2007  Shumarayev et al. ... 375/376
2008/0189563 A1 * 8/2008  Itkin ................... 713/300

* cited by examiner

*Primary Examiner*—Vibol Tan
(74) *Attorney, Agent, or Firm*—Ropes & Gray LLP; Robert R. Jackson

(57) ABSTRACT

A programmable logic device ("PLD") or the like has a plurality of data transmitter channels. Certain circuitry is shared by the channels. The shared circuitry includes at least one phase-locked loop ("PLL") circuit for producing a primary clock signal, and global frequency divider circuitry for producing at least one global secondary clock signal based on the primary signal. The primary and global secondary signal(s) are distributed to the channels. Each of the channels includes local frequency divider circuitry for producing at least one local secondary clock signal based on the primary signal. Each channel also includes selection circuitry for selecting either the global or local secondary signal(s) for use by clock utilization circuitry of the channel. The clock utilization circuitry may include serializer circuitry for converting data from parallel to serial form.

14 Claims, 3 Drawing Sheets

CLOCK SIGNAL CIRCUITRY FOR MULTI-CHANNEL DATA SIGNALING

This application claims the benefit of U.S. provisional patent application 60/705,521, filed Aug. 3, 2005, which is hereby incorporated by reference herein in its entirety.

BACKGROUND OF THE INVENTION

This invention relates to integrated circuits that can be used for multi-channel data communication of various types and that are programmable or configurable in at least some respects to support different communication protocols. For example, the invention can be implemented in a programmable logic device ("PLD") or field-programmable gate array ("FPGA"). For ease of reference (and not with the intention of limiting the invention in any way), all integrated circuits to which the invention can be applied will sometimes be referred to as PLDs.

There are many different data communication protocols that it may be desirable for a PLD to be able to support. One large class of these communication protocols is known as high-speed serial communication. High-speed serial communication protocols use one or more channels of serial data communication between devices in a system. A device involved in such communication typically includes several transmitter channels, each of which can convert parallel data to serial data for transmission off the device. Another device involved in such communication typically includes several receiver channels, each of which can receive a serial data signal and convert that information to parallel data. If multiple channels are used, they may function independently or relatively independently of one another, or a high degree of synchronization may be required among them.

It is desirable, for reasons such as economy, to share resources among several communication channels on a device. However, some communication protocols or arrangements may require multiple channels to operate independently of one another to a degree that does not permit as much sharing of resources as is possible for other communication protocols or arrangements. It is therefore desirable to provide a good balance between individual communication channel capability and capability that can be shared among several channels.

SUMMARY OF THE INVENTION

In accordance with the present invention, several transmitter channels on a PLD share clock management unit ("CMU") circuitry. The CMU circuitry includes at least one phase-locked loop ("PLL") circuit for producing a primary clock signal, and so-called "global" frequency divider circuitry for producing one or more secondary clock signals from the primary clock signal. The primary and secondary clock signals are distributed to the several transmitter channels that are associated with the CMU. Each channel includes so-called "local" frequency divider circuitry for producing one or more locally generated secondary clock signals from the primary clock signal. Each channel can use either the globally generated secondary clock signal(s) or its own locally generated clock signal(s). For example, if the communication protocol or arrangement being implemented requires a high degree of synchronization among several channels, that synchronization can be provided by having these channels use the globally generated secondary clock signal(s). On the other hand, if the channels are to be operated more independently of one another, the local frequency dividers can be used, with only PLL resources of the CMU being shared.

Further features of the invention, its nature and various advantages, will be more apparent from the accompanying drawings and the following detailed description.

DETAILED DESCRIPTION

Technology that can be related to what is shown and described herein is shown and described in Bereza et al. U.S. Pat. No. 7,304,498, which is hereby incorporated by reference herein in its entirety.

Figure 1:
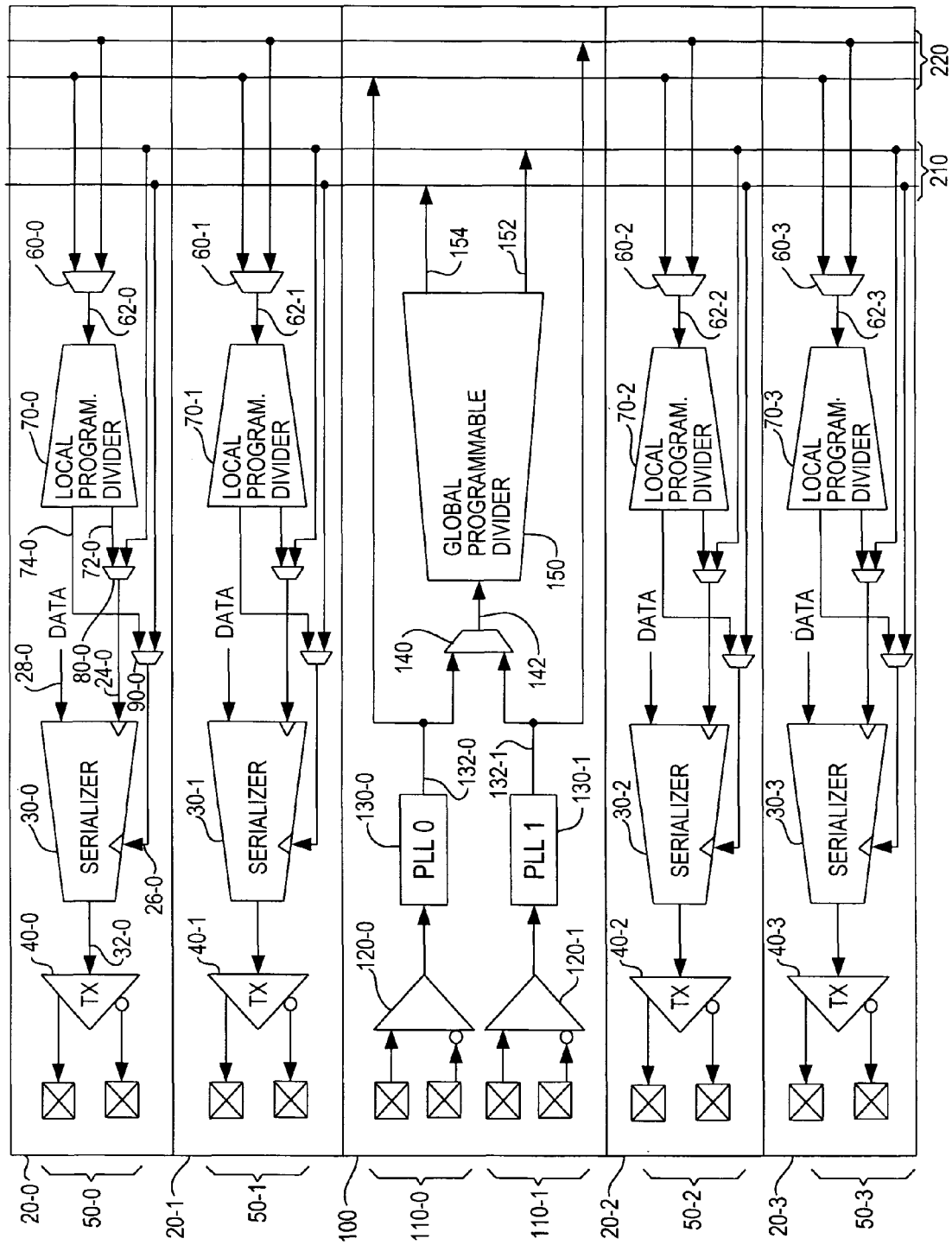
FIG. 1 is a simplified schematic block diagram of an illustrative embodiment of circuitry constructed in accordance with the invention.

FIG. 1 shows four channels 20-0 through 20-3 of transmitter circuitry on a PLD. FIG. 1 also shows one instance of clock management circuitry 100 that is shared by the depicted transmitter channels 20.

Each transmitter channel 20 includes serializer circuitry 30 for receiving a certain number of data bits 28 in parallel and for converting that data to a serial data output signal 32. For example, the ultimate source of data 28 may be the core logic (not shown) of the PLD that includes circuitry 20/100. The serial data signal 32 of each channel is applied to an output driver 40 of that channel. Each output driver 40 may convert the applied serial data signal to a differential signal pair, which is applied to an associated pair of output pins 50 of the PLD.

To perform its function, each serializer circuit 30 needs a low frequency clock signal 24 and a high frequency clock signal 26. For example, the low frequency clock signal 24 is typically a byte-rate clock signal (i.e., a signal having a frequency that corresponds to the rate at which parallel bytes of data 28 are applied to the associated serializer 30). (As used herein, a byte is any plural number of bits.) The high frequency clock signal 26 is typically a bit-rate clock signal (i.e., a signal having a frequency that corresponds to the rate at which serial data bits 32 are output by the serializer). If a channel is dealing with ten-bit bytes, this will mean that the frequency of the associated high frequency clock 26 is ten times the frequency of the associated low frequency clock 24. The ultimate source of clock signals 24 and 26 is CMU circuitry 100. The following are some examples of high and low frequency clocks that may be used: for the standard known as CEI, a serial bit rate of 6.25 Gbps and a parallel frequency of 390 MHz (a ratio of 16 (nominally)); for the standard known as XAUI, a serial bit rate of 3.125 Gbps and a parallel frequency of 390 MHz (a ratio of 8 (nominally)); and for the standard known as PCI-Express ("PCI-E"), a serial bit rate of 2.5 Gbps and a parallel frequency of 250 MHz (a ratio of 10).

In the embodiment shown in FIG. 1, CMU 100 includes input pins 110 for each of two differential reference clock signals. Each differential reference clock signal is applied to a respective one of buffer circuits 120. The output signal of each buffer circuit 120 is applied to a respective one of PLL circuits 130. Each PLL circuit 130 uses the applied reference clock signal to enable it to produce a respective one of so-called "primary" clock signals 132. For example, for CEI the reference clock signal frequency may be 156.25 MHz and the CMU PLL output frequency may be 3.125 GHz. (A half-rate architecture may be used whereby clocking of serial data is on both clock edges, which produces a serial bit rate of 6.25 Gbps.) For XAUI the reference clock signal frequency may again be 156.25 MHz and the CMU PLL output frequency may be 1.5625 GHz. (Again, the half-rate architecture results in a serial bit rate of 3.125 Gbps.) For PCI-E the reference clock signal frequency may be 100 MHz and the CMU PLL output frequency is 1.250 GHz. (Once again, the half-rate architecture results in a serial bit rate of 2.5 Gbps.)

Primary clock signals 132-0 and 132-1 are respectively applied to the two selectable input terminals of multiplexer ("mux") 140. Mux 140 is controlled (e.g., by a programmable configuration random access memory ("CRAM") cell (not shown)) to select one of its two input signals 132 as its output signal 142. The thus-selected primary clock signal 142 is applied to global programmable divider circuitry 150.

Circuitry 150 uses the applied primary clock signal 142 to produce two global secondary clock signals 152 and 154. Clock signal 154 typically has a higher frequency than clock signal 152. For example, circuitry 150 may divide the frequency of primary clock signal 142 by different factors to produce signals 152 and 154. These factors may be programmable or otherwise selectable, and they may have values ranging from less than one to more than one. To tie this discussion back to something said earlier, signal 152 may be a byte-rate clock signal and signal 154 may be a bit-rate clock signal.

Signals 152 and 154 are applied to clock signal distribution conductors 210. These are conductors that extend from CMU 100 into all of the channels 20 associated with that CMU. In each channel 20 the conductor 210 signal that is from source 152 is applied to one selectable input terminal of mux 80. Similarly, in each channel 20 the conductor 210 signal that is from source 154 is applied to one selectable input terminal of mux 90.

Returning to CMU 100, each of primary clock signals 132-0 and 132-1 is applied to a respective one of further clock signal distribution conductors 220. Like conductors 210, conductors 220 extend from CMU 100 into all of the channels 20 associated with that CMU. In each channel 20 the primary clock signals from conductors 220 are applied to respective selectable input terminals of the mux 60 in that channel. Each mux 60 is controllable (in the same general way as mux 140, but independently of the control of mux 140) to select either of its selectable inputs as the source of its output signal 62. Each of signals 62 is applied to local programmable divider circuitry 70 in the associated channel 20.

Each of circuitries 70 can be similar to above-described circuitry 150. Accordingly, each of circuitries 70 can use the signal 62 applied to it to produce locally generated high and low frequency secondary clock signals 72 and 74. The frequency dividing factors employed by each of circuitries 70 can be independent of those used by other circuitries 70 and 150. These factors can, however, be generally similar in nature to those described above for circuitry 150, and they can be supplied in the same general way (although, again, independently) as described above for circuitry 150.

In each channel 20, the associated signal 72 is applied to the second selectable input terminal of mux 80, and the associated signal 74 is applied to the second selectable input terminal of mux 90. Each of muxes 80 and 90 is controllable in the same general way as described above for mux 140 (although, again, independently) to select either of its inputs as the source of its output signal. The output signal of the mux 80 in a channel is the above-described low frequency input 24 to the serializer 30 in that channel. The output signal of the mux 90 in a channel is the above-described high frequency input 26 to the serializer 30 in that channel.

From the foregoing, it will be seen that each channel 20 can get the low and high frequency clock signals 24 and 26 for its serializer 30 from either global frequency divider circuitry 150 or from its own local frequency divider circuitry 70. In all cases, all of channels 20 ultimately share the PLL 130 resources of shared CMU 100. The individual channels do not need and do not have their own PLL circuits, which has a number of advantages, such as reducing the proliferation of relatively noisy, space-consuming, and power-consuming PLL circuits. Channels that must be synchronized with one another can be thus synchronized by using the output signals of global circuitry 150. Any channel that needs to operate independently can do so by using its own local circuitry 70.

By giving CMU 100 two PLLs 130, the CMU can work with two different reference clock signals 110-0 and 110-1. Some one or more of channels 20 can work with the output signal of PLL 130-0, while other one or more of channels 20 work with the output signal of PLL 130-1. Some channels 20 can work together, sharing circuitry 150, while other one or more channels 20 work independently using their own circuitry 70. Different channels 20 can even be implementing different communication protocols. As an example of this last point (and continuing with the illustrative specifics mentioned earlier for CEI and XAUI), if it is desired to use one CMU 100 to drive CEI and XAUI, this can be done by using the above-mentioned CEI configuration with reference clock frequency 156.25 MHz and CMU PLL 130 output frequency 3.125 GHz. This output would feed two (or more) channels 20, where one channel would not use local bit rate division and hence would have the CEI serial bit rate of 6.25 Gbps, while another channel would use local bit rate division by 2 and hence would have the XAUI serial bit rate of 3.125 Gbps.

Figure 2:
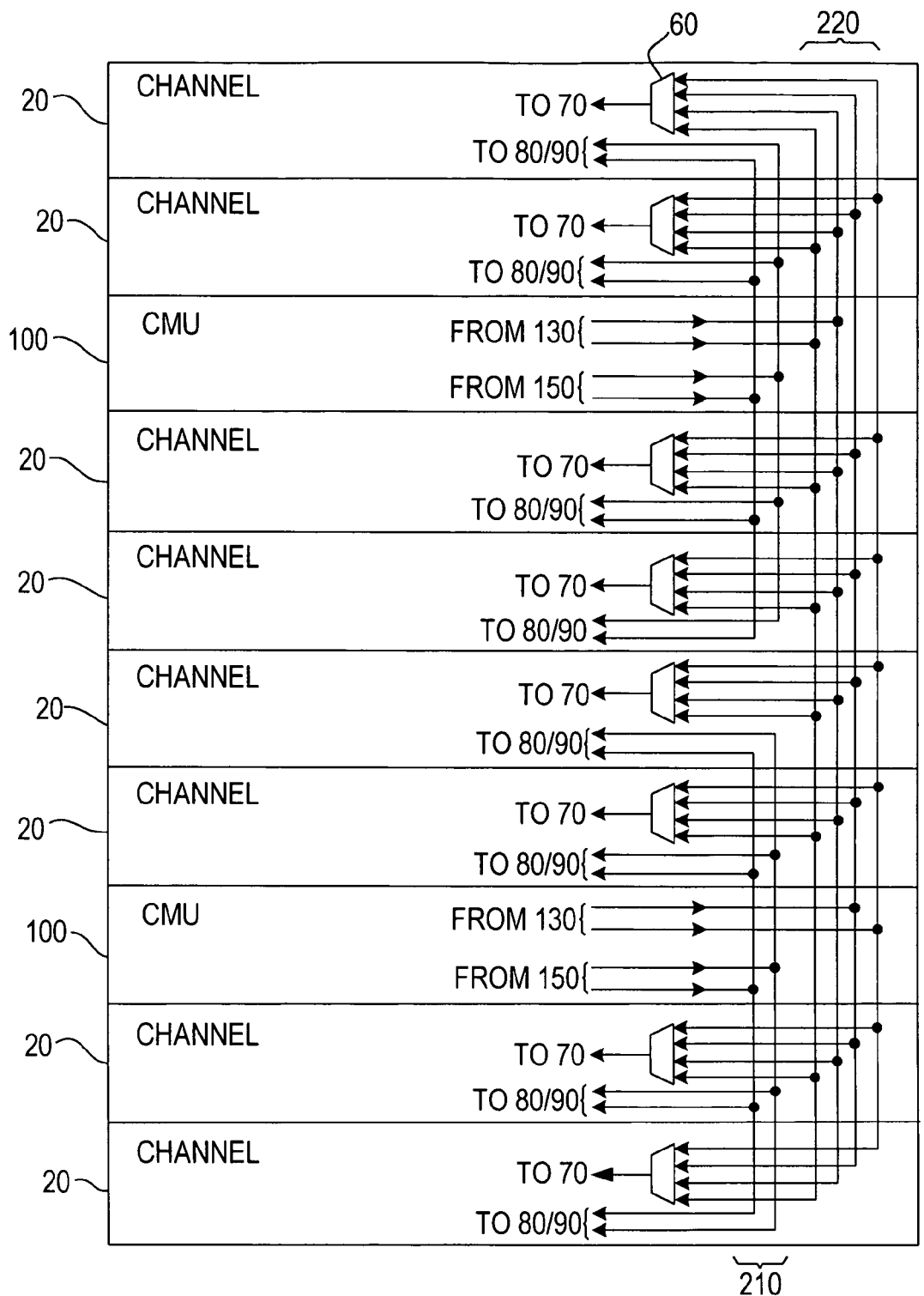
FIG. 2 is a simplified schematic block diagram showing an illustrative embodiment of extension of what is shown in FIG. 1 to include more circuitry in accordance with the invention.

Either or both of conductor types 210 and 220 can be extended to one or more additional groups of circuitry like the circuit group shown in FIG. 1. If that is done, the number of the extended conductors can be increased, and the size of the multiplexers 60, 80, and 90 in each channel 20 can be increased to accommodate more inputs and therefore more options. In this way, more channels 20 can share a given PLL, and/or a channel 20 can have more PLLs to choose from for its clock signal source(s). For example, FIG. 2 shows two instances of circuitry of the general type shown in FIG. 1. Conductors 210 are not extended between the two instances in FIG. 2. However, conductors 220 are extended between those instances. The number of conductors 220 is accordingly doubled, and so is the size of each mux 60 in each channel 20.

Figure 3:
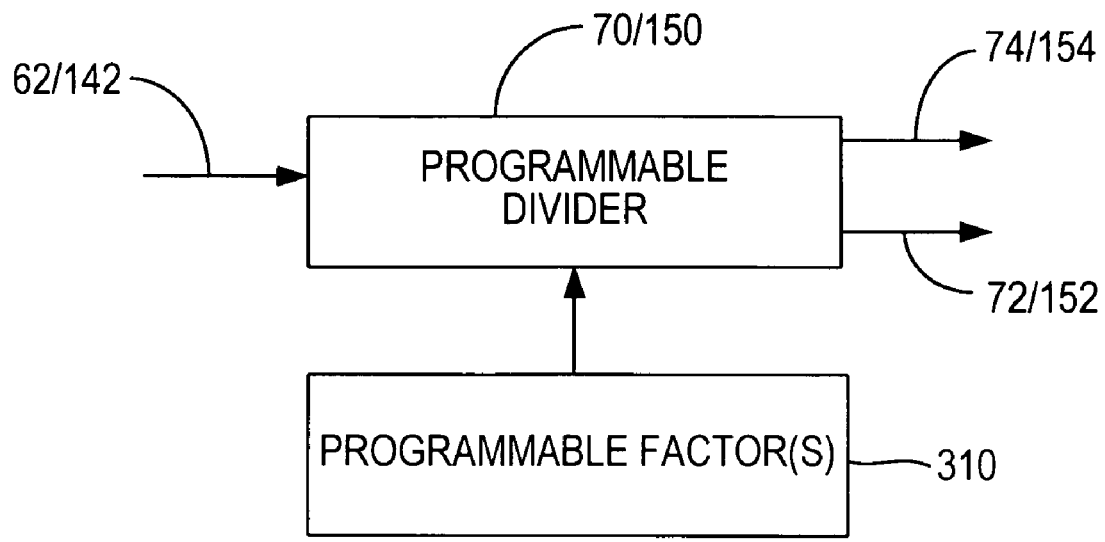
FIG. 3 is a simplified block diagram showing an illustrative embodiment of a representative portion of what is shown in FIGS. 1 and 2 in somewhat more detail in accordance with the invention.
Figure 4:
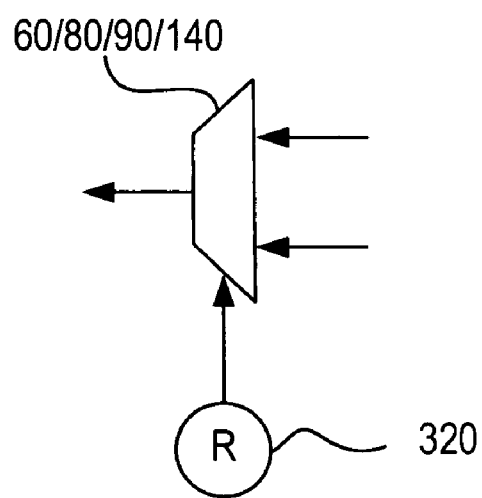
FIG. 4 is a simplified block diagram showing an illustrative embodiment of another representative portion of what is shown in FIGS. 1 and 2 in somewhat more detail in accordance with the invention.

FIG. 3 brings out the point that the frequency dividing factors employed by any of circuits 70 and/or 150 can be programmable (e.g., from programmable CRAM circuitry 310). FIG. 4 brings out the point that control of any of muxes 60, 80, 90, and/or 140 can be programmable (e.g., from programmable CRAM circuitry 320).

It will be understood that the foregoing is only illustrative of the principles of the invention and that various modifications can be made by those skilled in the art without departing from the scope and spirit of the invention. For example, the association of four channels 20 with each CMU 100 is only illustrative, and any other desired number of channels can be associated with a CMU. As another example, a CMU 100 can include two PLLs 130 as shown in FIG. 1, or any other desired number of PLLs, such as one, three, or more.

The invention claimed is:

1. A PLD comprising:
   a plurality of channels of data transmitter circuitry;
   CMU circuitry shareable by the channels and including PLL circuitry for producing a primary clock signal, and global frequency divider circuitry for producing first and second global secondary clock signals based on the primary clock signal;
   circuitry for distributing the primary and first and second global secondary clock signals to the channels; and
   within each of the channels, local frequency divider circuitry for producing first and second local secondary clock signals based on the primary clock signal, and selection circuitry for selecting the first and second global or the first and second local secondary clock signals for use by clock signal utilization circuitry of the channel.

2. The PLD defined in claim 1 wherein the global frequency divider circuitry is programmable with respect to factors by which it divides frequency of the primary clock signal to produce frequencies of the first and second global secondary clock signals.

3. The PLD defined in claim 1 wherein each of the local frequency divider circuitries is programmable with respect to factors by which it divides frequency of the primary clock signal to produce frequencies of the first and second local secondary clock signals.

4. The PLD defined in claim 1 wherein each of the selection circuitries is programmable with respect to the signals it selects.

5. The PLD defined in claim 1 wherein each of the signal utilization circuitries comprises serializer circuitry for converting data from parallel form, presented at a byte rate, to serial form at a bit rate.

6. The PLD defined in claim 5 wherein the first global and first local secondary clock signals have a byte rate frequency.

7. The PLD defined in claim 6 wherein the second global and second local secondary clock signals have a bit rate frequency.

8. A PLD comprising:
   a plurality of channels of data transmitter circuitry;
   CMU circuitry shareable by the channels and including a plurality of PLL circuits, each of which produces a respective one of a plurality of primary clock signals, and global frequency divider circuitry for producing first and second global secondary clock signals based on a selectable one of the primary clock signals;
   circuitry for distributing the primary clock signals and the first and second global secondary clock signals to the channels; and
   within each of the channels, local frequency divider circuitry for producing first and second local secondary clock signals based on a selectable one of the primary clock signals, and selection circuitry for selecting the first and second global or the first and second local secondary clock signals for use by the clock signal utilization circuitry of the channel.

9. The PLD defined in claim 8 wherein the global frequency divider circuitry is programmable with respect to factors by which it divides frequency of a selected one of the primary clock signals to produce frequencies of the first and second global secondary clock signals.

10. The PLD defined in claim 8 wherein each of the local frequency divider circuitries is programmable with respect to factors by which it divides frequency of a selected one of the primary clock signals to produce frequencies of the first and second local secondary clock signals.

11. The PLD defined in claim 8 wherein each of the selection circuitries is programmable with respect to the signal it selects.

12. The PLD defined in claim 8 wherein each of the signal utilization circuitries comprises serializer circuitry for converting data from parallel form, presented at a byte rate, to serial form at a bit rate.

13. The PLD defined in claim 12 wherein the first global and first local secondary clock signals have a byte rate frequency.

14. The PLD defined in claim 13 wherein the second global and second local secondary clock signals have a bit rate frequency.

* * * * *